(12) United States Patent
Jeong et al.

(10) Patent No.: US 9,130,599 B2
(45) Date of Patent: Sep. 8, 2015

(54) SYSTEMS AND METHODS OF CONVERTING DETECTOR OUTPUT TO MULTI-LEVEL SOFT INFORMATION

(71) Applicant: LSI Corporation, San Jose, CA (US)

(72) Inventors: Seongwook Jeong, Sunnyvale, CA (US); Lu Pan, San Jose, CA (US); Jianzhong Huang, San Jose, CA (US); Haitao Xia, San Jose, CA (US)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 36 days.

(21) Appl. No.: 14/140,451

(22) Filed: Dec. 24, 2013

(65) Prior Publication Data

US 2015/0180512 A1  Jun. 25, 2015

(51) Int. Cl.
*G11B 5/09* (2006.01)
*H03M 13/45* (2006.01)
*G11B 20/10* (2006.01)
*H03M 13/11* (2006.01)

(52) U.S. Cl.
CPC ........ *H03M 13/458* (2013.01); *G11B 20/10037* (2013.01); *G11B 20/10046* (2013.01); *G11B 20/10287* (2013.01); *H03M 13/1108* (2013.01); *H03M 13/1111* (2013.01)

(58) Field of Classification Search
None
See application file for complete search history.

(56) References Cited

U.S. PATENT DOCUMENTS

| | | | |
|---|---|---|---|
| 4,462,101 A * | 7/1984 | Yasuda et al. | 714/794 |
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku et al. | |
| 5,523,903 A | 6/1996 | Hetzler | |
| 5,550,810 A | 8/1996 | Monogioudis | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccallister | |
| 6,023,783 A | 2/2000 | Divsalar | |
| 6,029,264 A | 2/2000 | Kobayashi | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Peter Vincent Agustin
(74) *Attorney, Agent, or Firm* — Hamilton DeSanctis & Cha

(57) ABSTRACT

A data processing system includes a binary data detector having a hard decision output, a reliability calculator operable to calculate an error pattern reliability metric for each of a number of dominant error patterns associated with the hard decision output, and a converter operable to convert the error pattern reliability metrics to multi-level soft information.

20 Claims, 4 Drawing Sheets

(56) References Cited

U.S. PATENT DOCUMENTS

| | | | |
|---|---|---|---|
| 6,065,149 A | 5/2000 | Yamanaka | |
| 6,069,856 A * | 5/2000 | Mita et al. | 369/47.19 |
| 6,097,764 A | 8/2000 | McCallister | |
| 6,145,110 A | 11/2000 | Khayrallah | |
| 6,158,027 A * | 12/2000 | Bush et al. | 714/709 |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,446,236 B1 * | 9/2002 | McEwen et al. | 714/795 |
| 6,473,878 B1 | 10/2002 | Wei | |
| 6,535,553 B1 | 3/2003 | Limberg | |
| 6,587,987 B1 * | 7/2003 | Vasic et al. | 714/780 |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,977,972 B1 * | 12/2005 | Kandala et al. | 375/332 |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,319,726 B1 * | 1/2008 | Wu et al. | 375/342 |
| 7,369,343 B1 * | 5/2008 | Yeo et al. | 360/60 |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,107,306 B2 * | 1/2012 | Vigoda et al. | 365/191 |
| 8,194,801 B1 * | 6/2012 | Bitran et al. | 375/341 |
| 8,201,051 B2 | 6/2012 | Tan | |
| 8,237,597 B2 | 8/2012 | Liu et al. | |
| 8,261,171 B2 | 9/2012 | Annampedu | |
| 8,291,284 B2 | 10/2012 | Savin | |
| 8,295,001 B2 | 10/2012 | Liu | |
| 8,566,666 B2 | 10/2013 | Wang | |
| 8,595,576 B2 | 11/2013 | Yen | |
| 8,650,451 B2 | 2/2014 | Krishnan | |
| 8,656,249 B2 | 2/2014 | Chen | |
| 8,681,441 B2 | 3/2014 | Yang | |
| 8,687,310 B1 * | 4/2014 | Zhang et al. | 360/65 |
| 8,700,981 B2 | 4/2014 | Krachkovsky | |
| 8,719,686 B2 | 5/2014 | Chen | |
| 8,756,478 B2 | 6/2014 | Wang | |
| 2002/0023247 A1 * | 2/2002 | Akiyama et al. | 714/758 |
| 2002/0114247 A1 * | 8/2002 | Indukumar et al. | 369/59.16 |
| 2003/0151838 A1 * | 8/2003 | Sawaguchi et al. | 360/46 |
| 2006/0195775 A1 * | 8/2006 | Cideciyan et al. | 714/800 |
| 2008/0069373 A1 | 3/2008 | Jiang | |
| 2008/0148129 A1 * | 6/2008 | Moon et al. | 714/758 |
| 2008/0304558 A1 | 12/2008 | Zhu et al. | |
| 2009/0132893 A1 | 5/2009 | Miyazaki | |
| 2009/0185643 A1 | 7/2009 | Fitzpatrick el. | |
| 2009/0231745 A1 * | 9/2009 | Venkataramani et al. | 360/39 |
| 2010/0165730 A1 * | 7/2010 | Sommer et al. | 365/185.03 |
| 2011/0164707 A1 * | 7/2011 | Luo et al. | 375/341 |
| 2011/0167227 A1 | 7/2011 | Yang | |
| 2011/0261904 A1 * | 10/2011 | Seier et al. | 375/298 |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |
| 2013/0007570 A1 | 1/2013 | Seago | |
| 2013/0024740 A1 | 1/2013 | Xia | |
| 2013/0046958 A1 | 2/2013 | Zhang | |
| 2013/0080844 A1 | 3/2013 | Xu | |
| 2013/0111306 A1 | 5/2013 | Chang | |
| 2013/0139022 A1 | 5/2013 | Chen | |
| 2013/0139023 A1 | 5/2013 | Han | |
| 2013/0335850 A1 * | 12/2013 | Han et al. | 360/53 |
| 2014/0185421 A1 * | 7/2014 | Nakamura et al. | 369/103 |
| 2014/0240863 A1 * | 8/2014 | Parthasarathy et al. | 360/39 |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al "A Viterbi Algorithm with Soft-Decision Outputs and its Applications" in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

(56) References Cited

OTHER PUBLICATIONS

Lin et al "An efficient VLSI Architecture for non binary LDPC decoders"—IEEE Transaction on Circuits and Systems II vol. 57, Issue 1 (Jan. 2010) pp. 51-55.
Moon et al, "Pattern-dependent noise prediction in signal-dependent Noise," IEEE JSAC, vol. 19, No. 4 pp. 730-743, Apr. 2001.
Moon et al., "Maximum transition run codes for data storage systems", IEEE Trans. Magn., vol. 32, No. 5, pp. 3992-3994 (Sep. 1996).
Shokrollahi "LDPC Codes: An Introduction", Digital Fountain, Inc. (Apr. 2, 2003).
Spagnol et al, "Hardware Implementation of GF(2m) LDPC Decoders", IEEE Transactions on Circuits and Systemsši: Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/295,150, filed Nov. 14, 2011, Zongwang Li, Unpublished.
U.S. Appl. No. 13/327,279, filed Dec. 15, 2011, Wei Feng, Unpublished.
U.S. Appl. No. 14/070,541, filed Nov. 3, 2013, Dan Liu, Unpublished.
U.S. Appl. No. 13/316,741, filed Dec. 12, 2011, Yang Han, Unpublished.
U.S. Appl. No. 13/340,951, filed Dec. 30, 2011, Lei Chen, Unpublished.
U.S. Appl. No. 13/269,852, filed Oct. 10, 2011, Haitao Xia, Unpublished.
U.S. Appl. No. 13/284,730, filed Oct. 28, 2011, Fan Zhang, Unpublished.
U.S. Appl. No. 13/284,767, filed Oct. 28, 2011, Fan Zhang, Unpublished.
U.S. Appl. No. 13/113,219, filed May 23, 2011, Yang Han, Unpublished.
U.S. Appl. No. 13/316,858, filed Dec. 12, 2011, Zongwang Li, Unpublished.
U.S. Appl. No. 13/340,974, filed Dec. 30, 2011, Dan Liu, Unpublished.
U.S. Appl. No. 13/269,832, filed Oct. 10, 2011, Haitao Xia, Unpublished.
U.S. Appl. No. 13/777,976, filed Feb. 26, 2013, Shu Li, Unpublished.
U.S. Appl. No. 13/622,294, filed Sep. 18, 201, Fan Zhang, Unpublished.
U.S. Appl. No. 13/912,079, filed Jun. 6, 2013, Zongwang Li, Unpublished.
U.S. Appl. No. 14/048,897, filed Oct. 8, 2013, George Mathew, Unpublished.
U.S. Appl. No. 13/369,468, filed Feb. 9, 2012, Zongwang Li, Unpublished.
U.S. Appl. No. 14/015,126, filed Aug. 30, 2013, Lu Pan, Unpublished.
U.S. Appl. No. 13/947,768, filed Jul. 22, 2013, Johnson Yen, Unpublished.
U.S. Appl. No. 13/597,026, filed Aug. 28, 2012, Fan Zhang, Unpublished.
U.S. Appl. No. 13/777,841, filed Feb. 26, 2013, Shu Li, Unpublished.
U.S. Appl. No. 13/989,583, filed Oct. 15, 2012, Shaohua Yang, Unpublished.
U.S. Appl. No. 13/777,381, filed Feb. 26, 2013, Shaohua Yang, Unpublished.
U.S. Appl. No. 13/741,003, filed Jan. 14, 2013, Lu Lu, Unpublished.
U.S. Appl. No. 13/873,224, filed Apr. 30, 2013, Razmik Karabed, Unpublished.
U.S. Appl. No. 13/875,951, filed May 2, 2013, Mikhail I Grinchuk, Unpublished.
U.S. Appl. No. 13/742,340, filed Jan. 15, 2013, Razmik Karabed, Unpublished.
U.S. Appl. No. 13/886,103, filed May 2, 2013, Chung-Li Wang, Unpublished.
U.S. Appl. No. 13/898,685, filed May 21, 2013, Dan Liu, Unpublished.
U.S. Appl. No. 13/670,393, filed Nov. 6, 2012, Lei Chen, Unpublished.
U.S. Appl. No. 13/545,833, filed Jul. 10, 2012, Zhi Bin Li, Unpublished.
U.S. Appl. No. 13/445,878, filed Apr. 12, 2012, Yu Liao, Unpublished.
U.S. Appl. No. 13/474,660, filed May 17, 2012, Zongwang Li, Unpublished.
U.S. Appl. No. 13/363,751, filed Feb. 1, 2012, Lei Chen, Unpublished.
U.S. Appl. No. 13/362,409, filed Jan. 31, 2012, Fan Zhang, Unpublished.
U.S. Appl. No. 13/422,986, filed Mar. 16, 2012, Fan Zhang, Unpublished.
U.S. Appl. No. 13/621,341, filed Sep. 17, 2012, Shaohua Yang, Unpublished.
U.S. Appl. No. 13/433,693, filed Mar. 29, 2012, Fan Zhang, Unpublished.
U.S. Appl. No. 13/426,714, filed Mar. 22, 2012, Shaohua Yang, Unpublished.
U.S. Appl. No. 13/445,834, filed Apr. 12, 2012, Chung-Li Wang, Unpublished.
U.S. Appl. No. 13/596,819, filed Aug. 28, 2012, Shaohua Yang, Unpublished.
U.S. Appl. No. 13/596,947, filed Aug. 28, 2012, Fan Zhang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/412,520, filed Mar. 5, 2012, Fan Zhang, Unpublished.
U.S. Appl. No. 13/445,848, filed Apr. 12, 2012, Bruce A. Wilson, Unpublished.
U.S. Appl. No. 13/619,907, filed Sep. 14, 2012, Fan Zhang, Unpublished.
U.S. Appl. No. 13/372,580, filed Feb. 14, 2012, Fan Zhang, Unpublished.
Vasic, B., "High-Rate Girth-Eight Codes on Rectangular Integer Lattices", IEEE Trans. Communications, vol. 52, Aug. 2004, pp. 1248-52.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-55, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-23, Mar. 7.
Zhong et al., "Design of VLSI Implementation-Oriented LDPC Codes", IEEE, pp. 670-673, 2003.
Zhong et al., "Joint Code-Encoder Design for LDPC Coding System VLSI Implementation", ISCAS, IEEE pp. 389-392, May 2004.
Zhong et al., "High-Rate Quasi-Cyclic LDPC Codes for Magnetic Recording Channel with Low Error Floor", ISCAS, IEEE pp. 3546-3549, May 2006.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS OF CONVERTING DETECTOR OUTPUT TO MULTI-LEVEL SOFT INFORMATION

FIELD OF THE INVENTION

Various embodiments of the present invention provide systems and methods for generating multi-level soft information based on error pattern reliability for partial response channels.

BACKGROUND

Various products including hard disk drives utilize a read channel device to retrieve information from a medium and to detect and decode the values of the data originally written to the medium. Such read channel devices may include data processing circuits including a data detector circuit and a data decoder circuit. The ability to detect the original stored data patterns in the received data samples from the analog to digital converter is important to the accurate transfer of data. Data decoder circuits can be binary or non-binary. A non-binary low density parity check code is an example of an encoding algorithm that is significantly improved over binary low density parity check codes, although a non-binary low density parity check decoder has a relatively high complexity. Similarly, non-binary data detector circuits such as symbol-based Bahl-Cocke-Jalinek-Raviv (BCJR) detectors have a relatively high computational complexity in comparison with binary data detector circuits.

SUMMARY

Various embodiments of the present invention provide systems, apparatuses and methods for converting a binary detector hard decision output to multi-level soft information based on error pattern reliability for partial response channels.

In some embodiments, a data processing system includes a binary data detector having a hard decision output, a reliability calculator operable to calculate an error pattern reliability metric for each of a number of dominant error patterns associated with the hard decision output, and a converter operable to convert the error pattern reliability metrics to multi-level soft information.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components.

In the figures, like reference numerals are used throughout several figures to refer to similar components.

DETAILED DESCRIPTION OF THE INVENTION

Various embodiments of the present invention provide systems, apparatuses and methods for converting a binary detector hard decision output to multi-level soft information based on error pattern reliability for partial response channels. The binary detector and output converter can be used in a variety of applications, such as in a read channel or partial response channel for a storage or transmission device, in which data detection and data decoding processes are iteratively performed to detect the values of input data and to correct any errors. In some embodiments of such a read channel, a few specific error patterns dominate the error rate at the detector output because the energy of channel output with these error patterns is smaller than with other patterns. By using the reliability measures for these dominant error patterns for each position in the binary detector output, the output converter can generate multi-level soft information for each symbol. A non-binary or symbol based decoder can then be used in the read channel to decode the codeword represented by the multi-level soft information from the output converter. The binary detector is thus a relatively simple and fast detector such as a maximum likelihood detector or Viterbi detector, applying a bit-by-bit detection algorithm and yielding a binary detector output. The non-binary decoder can use the multi-level soft information from the output converter, a multi-bit symbol based input that includes likelihood information for each possible value of each symbol. By providing this likelihood information, the decoder is better able to quickly detect and correct errors and converge on the true data values. The binary detector and output converter provides performance as high as a soft input soft output maximum a posteriori (MAP) detector such as a symbol-based Bahl-Cocke-Jalinek-Raviv (BCJR) detector for some signal to noise ratios (SNRs), while using a substantially less complex binary detector such as, but not limited to, a maximum likelihood detector or a Viterbi detector.

The detector output conversion disclosed herein is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 1:
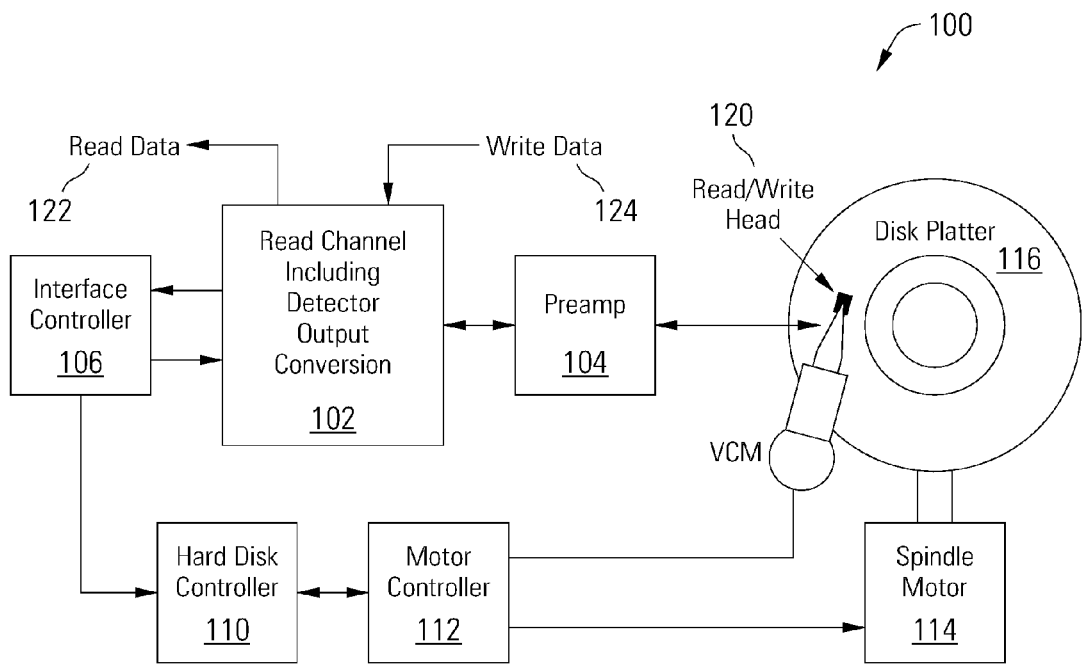
FIG. 1 shows a storage system including a read channel circuit having detector output conversion in accordance with some embodiments of the present invention.

Turning to FIG. 1, a storage system 100 is disclosed which includes a read channel circuit 102 with detector output conversion in accordance with some embodiments of the present invention. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head assembly 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly 120 to the proper data track on disk platter 116 under the direction of hard disk controller 110. Spindle motor 114 spins disk platter 116 at a determined spin rate (RPMs). Once read/write head assembly 120 is positioned adjacent the proper data track, magnetic signals representing data on disk platter 116 are sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 digitizes the received analog signal, performs a binary detection and output conversion process, and decodes the resulting multi-level soft information to recreate the information originally written to disk platter 116. This data is provided as read data 122 to a receiving circuit. The detection and output conversion can be performed using a circuit similar to that discussed in relation to FIG. 5, and/or can be performed consistent with a process discussed in relation to FIG. 9. A write operation is substantially the opposite of the preceding read operation with write data 124 being provided to read channel circuit 102. This data is then encoded and written to disk platter 116.

It should be noted that in some embodiments storage system 100 is integrated into a larger storage system such as, for example, a RAID (redundant array of inexpensive disks or redundant array of independent disks) based storage system. Such a RAID storage system increases stability and reliability through redundancy, combining multiple disks as a logical unit. Data can be spread across a number of disks included in the RAID storage system according to a variety of algorithms and accessed by an operating system as if it were a single disk. For example, data can be mirrored to multiple disks in the RAID storage system, or can be sliced and distributed across multiple disks in a number of techniques. If a small number of disks in the RAID storage system fail or become unavailable, error correction techniques can be used to recreate the missing data based on the remaining portions of the data from the other disks in the RAID storage system. The disks in the RAID storage system can be, but are not limited to, individual storage systems such storage system 100, and can be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that in some embodiments storage system 100 is modified to include solid state memory that is used to store data in addition to the storage offered by disk platter 116. This solid state memory may be used in parallel to disk platter 116 to provide additional storage. In such a case, the solid state memory receives and provides information directly to read channel circuit 102. Alternatively, the solid state memory may be used as a cache where it offers faster access time than that offered by disk platter 116. In such a case, the solid state memory may be disposed between interface controller 106 and read channel circuit 102 where it operates as a pass through to disk platter 116 when requested data is not available in the solid state memory or when the solid state memory does not have sufficient storage to hold a newly written data set. Based upon the disclosure provided herein, one of ordinary skill in the art will recognize a variety of storage systems including both disk platter 116 and a solid state memory.

Figure 2:
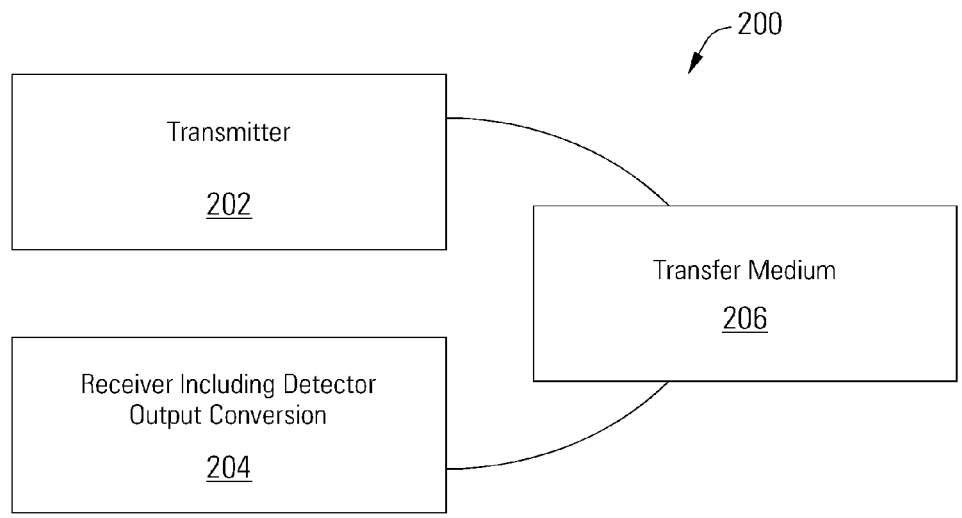
FIG. 2 depicts a wireless communication system including detector output conversion in accordance with some embodiments of the present invention.

Turning to FIG. 2, a wireless communication system 200 or data transmission device including a receiver 204 with detector output conversion is shown in accordance with some embodiments of the present invention. The transmitter 202 is operable to transmit encoded information via a transfer medium 206 as is known in the art. The encoded data is received from transfer medium 206 by receiver 204. Receiver 204 incorporates detector output conversion, including a binary detector and an output converter to yield multi-level soft information to use as an input to a decoder. The detection and output conversion can be performed using a circuit similar to that discussed in relation to FIG. 5, and/or can be performed consistent with a process discussed in relation to FIG. 9.

Figure 3:
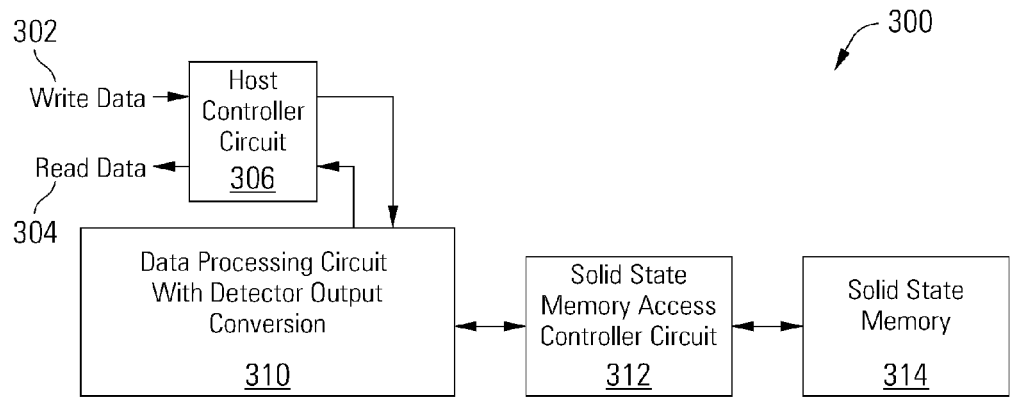
FIG. 3 depicts another storage system including detector output conversion in accordance with some embodiments of the present invention.

Turning to FIG. 3, another storage system 300 is shown that includes a data processing circuit 310 with detector output conversion in accordance with one or more embodiments of the present invention. A host controller circuit 306 receives data to be stored (i.e., write data 302). This data is provided to data processing circuit 310 where it is encoded using a low density parity check encoder or other suitable encoder. The encoded data is provided to a solid state memory access controller circuit 312. Solid state memory access controller circuit 312 can be any circuit known in the art that is capable of controlling access to and from a solid state memory. Solid state memory access controller circuit 312 formats the received encoded data for transfer to a solid state memory 314. Solid state memory 314 can be any solid state memory known in the art. In some embodiments of the present invention, solid state memory 314 is a flash memory. Later, when the previously written data is to be accessed from solid state memory 314, solid state memory access controller circuit 312 requests the data from solid state memory 314 and provides the requested data to data processing circuit 310. In turn, data processing circuit 310 applies a binary detection process and converts the binary output to multi-level soft information, which is decoded in any suitable detector such as, but not limited to, a non-binary low density parity check decoder. The detection and output conversion can be performed using a circuit similar to that discussed in relation to FIG. 5, and/or can be performed consistent with a process discussed in relation to FIG. 9. The decoded data is provided to host controller circuit 306 where it is passed on as read data 304.

Figure 4:
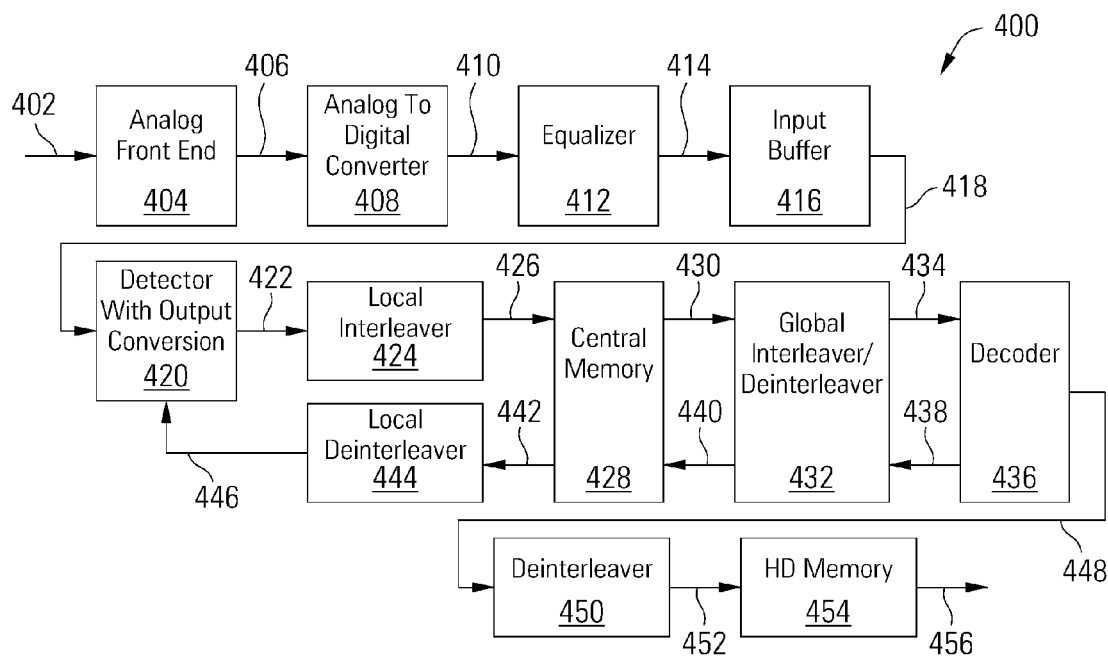
FIG. 4 is a block diagram of a read channel having detector output conversion in accordance with some embodiments of the present invention.

Again, the detector output conversion disclosed herein is not limited to use with any particular data processing system or application. Turning to FIG. 4, a data processing circuit 400 is shown that includes a detector with output conversion 420 in accordance with some embodiments of the present invention. Data processing system 400 includes an analog front end circuit 404 that receives an analog signal 402. Analog front end circuit 404 processes analog signal 402 and provides a processed analog signal 406 to an analog to digital converter circuit 408. Analog front end circuit 404 can include, but is not limited to, an analog filter and an amplifier circuit as are known in the art. Based upon the disclosure provided herein, one of ordinary skill in the art will recognize a variety of circuitry that may be included as part of analog front end circuit 404. In some cases, analog signal 402 is derived from a read/write head assembly (e.g., 120) that is disposed in relation to a storage medium (e.g., 116). Based upon the disclosure provided herein, one of ordinary skill in the art will recognize a variety of sources from which analog input 402 may be derived.

Analog to digital converter circuit 408 converts processed analog signal 406 into a corresponding series of digital samples 410. Analog to digital converter circuit 408 can be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 410 are provided to an equalizer circuit 412. Equalizer circuit 412 applies an equalization algorithm to digital samples 410 to yield an equalized output 414. In some embodiments of the present invention, equalizer circuit 412 is a digital finite impulse response filter circuit as are known in the art. Equalized output 414 is stored in an input buffer 416 until a data detector circuit 420 is available to process stored codeword 418. In other cases, equalizer 412 includes sufficient memory to maintain one or more codewords until a data detector circuit with output conversion 420 is available for processing. In some cases, equalized output 414 is received directly from a storage device in, for example, a solid state storage system. In such cases, analog front end circuit 404, analog to digital converter circuit 408 and equalizer circuit 412 are eliminated where the data is received as a digital data input.

Data detector circuit with output conversion 420 is operable to apply a data detection algorithm to a received codeword or data set and to convert the internal or intermediate binary detector output to multi-level soft information. In some embodiments of the present invention, data detector circuit 420 performs a Viterbi algorithm data detection process as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Based upon the disclosure provided herein, one of ordinary skill in the art will recognize a variety of data detector circuits that may be used in relation to different embodiments of the present invention. Data detector circuit 420 is started based upon availability of a data set from equalizer circuit 412 or from a central memory circuit 428.

Upon completion, data detector circuit 420 provides detector output 422, which includes multi-level soft information, and, in some embodiments, hard decisions. As used herein, the phrase "soft information" is used in its broadest sense to mean reliability data with each instance of the reliability data indicating a likelihood that a corresponding symbol or group of bit positions has been correctly detected. In some embodiments of the present invention, the soft information is log-likelihood ratio (LLR) data as is known in the art. Detected output 422 is provided to a local interleaver circuit 424. Local interleaver circuit 424 is operable to shuffle sub-portions (i.e., local chunks) of the data set included as detected output 422 and provides an interleaved codeword 426 that is stored to central memory circuit 428. Interleaver circuit 424 can be any circuit known in the art that is capable of shuffling data sets to yield a re-arranged data set.

The interleaved codeword 426 is accessed from central memory 428 as a stored codeword 430 that is globally interleaved by a global interleaver/deinterleaver circuit 432, yielding an interleaved output 434. In some embodiments, the local interleaver circuit 424 is operable to rearrange data segments within a portion of a codeword, and the global interleaver/deinterleaver circuit 432 is operable to rearrange data segments across the entire codeword.

The interleaved output 434 is decoded in a decoder circuit such as, but not limited to, a non-binary low density parity check (LDPC) decoder 436. Based upon the disclosure provided herein, one of ordinary skill in the art will recognize other decoding algorithms that may be used in relation to different embodiments of the present invention. The decoder 436 applies a data decoding algorithm to the interleaved output 434 in a variable number of local iterations internal to the decoder 436.

Where the decoder 436 fails to converge (i.e., fails to yield the originally written data set) and the number of local iterations through decoder 436 exceeds a threshold, the resulting decoded output 438 is globally deinterleaved in global interleaver/deinterleaver circuit 432 to yield a globally deinterleaved output 440 that is stored to central memory 428. The global deinterleaving reverses the global interleaving earlier applied to stored codeword 430. Once data detector circuit 420 is available, a previously stored deinterleaved output 442 is accessed from central memory 428 and locally deinterleaved by a deinterleaver circuit 444. Deinterleaver circuit 444 rearranges stored deinterleaved output 442 to reverse the shuffling originally performed by local interleaver circuit 424. A resulting deinterleaved output 446 is provided to data detector circuit 420 where it is used to guide subsequent detection of a corresponding codeword received as stored codeword 418 and for use in converting the intermediate hard decision detector output to multi-level soft information. Thus, the term "global iteration" refers to the processing of data once through the data detector 420 and decoder 436 and the system elements between them during an iterative process in which the decoded output 438 is used to guide the data detector 420 during a subsequent global iteration. In contrast, local decoding iterations take place during an iterative decoding operation within the decoder 436.

Alternatively, where the decoded output converges (i.e., yields the originally written data set) in the decoder 436, the resulting decoded output is provided as an output codeword 448 to a deinterleaver circuit 450. Deinterleaver circuit 450 rearranges the data to reverse both the global and local interleaving applied to the data to yield a deinterleaved output 452, stored in hard decision (HD) memory 454. The stored hard decision output 456 can then be provided to an external controller (not shown) or used in any other suitable manner.

Figure 5:
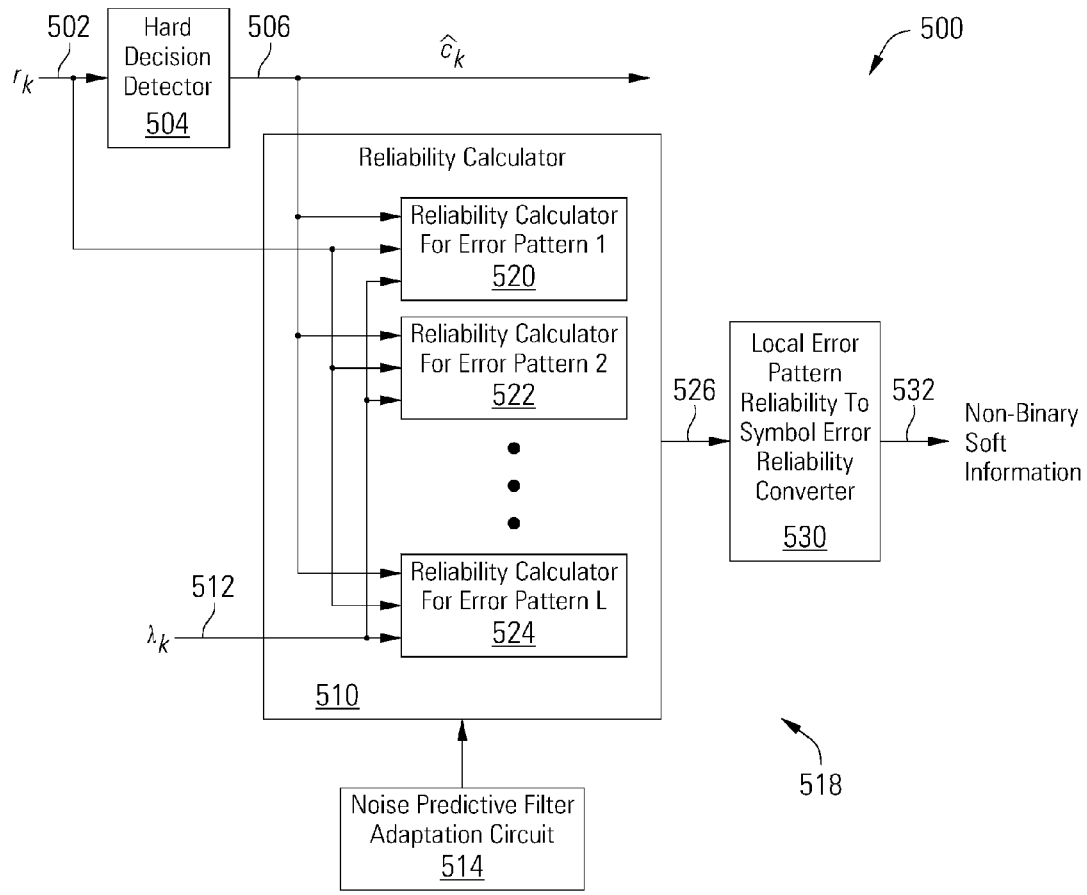
FIG. 5 is a block diagram of a binary data detector and output converter in accordance with some embodiments of the present invention.

Turning to FIG. 5, a binary data detector and output converter 500 is depicted in accordance with some embodiments of the present invention. A channel observation $r_k$ is provided as detector input 502. In some embodiments, the detector input comprises equalized digital data samples representing a codeword contained in a data sector or page from a storage device or another block of data from a transmission system. The detector input 502 is provided to a hard decision detector 504. In some embodiments of the present invention, hard decision detector 504 is a noise predictive maximum likelihood detector or a Viterbi detector as are known in the art. Based upon the disclosure provided herein, one of ordinary skill in the art will recognize a variety of data detector circuits that may be used in relation to different embodiments of the present invention. The hard decision detector 504 yields hard decisions at detector output 506, detected binary values of the detector input 502 that in some embodiments comprise a maximum likelihood word $\hat{c}_k$ that may include errors.

Although the partial response channel model has random noise, at the detector output 506 a few specific known error patterns dominate the error rate because the energy of channel output with these error patterns is smaller than with other patterns. The table below lists dominant error patterns of a channel with impulse response 1+0.85D, which make up 99.671% of the observed error pattern at bit error rate $5 \times 10^{-5}$. Each of the L error patterns $e^{(L)}$ is L bits long and occurs with the specified frequency in detector output 506. The error patterns $e^{(L)}$ are calculated as the actual data minus the detected value. Thus, error pattern $e^{(1)}$ is 2 when the actual bit is 1 and the detected value is −1, giving 1−(−1)=2, or −2 when the actual bit is −1 and the detected value is 1, giving (−1)−(1)=−2.

|  | Dominant Error Patterns | Frequency (%) |
|---|---|---|
| $e^{(1)}$ | ± [2] | 42.857 |
| $e^{(2)}$ | ± [2, −2] | 20.408 |
| $e^{(3)}$ | ± [2, −2, 2] | 18.762 |
| $e^{(4)}$ | ± [2, −2, 2, −2] | 9.348 |
| $e^{(5)}$ | ± [2, −2, 2, −2, 2] | 3.423 |
| $e^{(6)}$ | ± [2, −2, 2, −2, 2, −2] | 2.238 |
| $e^{(7)}$ | ± [2, −2, 2, −2, 2, −2, 2] | 1.185 |
| $e^{(8)}$ | ± [2, −2, 2, −2, 2, −2, 2, −2] | 1.053 |
| $e^{(9)}$ | ± [2, −2, 2, −2, 2, −2, 2, −2, 2] | 0.395 |

A reliability calculator 510 in the detector output converter 518 receives the detector output 506, the detector input 502, and a priori values $\lambda_k$ or actual values 512, which are obtained in some embodiments from a decoder. The reliability calculator 510 is a noise predictive correlator-based computation block operable to generate error pattern reliability data 526 for the local error patterns in detector output 506. The reliability calculator 510 includes a pattern reliability calculator 520, 522, 524 for each of the L dominant error patterns $e^{(L)}$. The dominant error patterns depend on the particular channel characteristics. The reliability calculator 510 calculates the error pattern reliability data 526 for the local error patterns based on the channel observation $r_k$ in detector input 502, on the maximum likelihood word $\hat{c}_k$ in detector output 504, the a priori values $\lambda_k$ or actual values 512, and on a noise variance $\sigma^2$ provided by the noise predictive filter adaptation circuit 514. The noise predictive filter adaptation circuit 514 is also operable to calculate noise predictive filter coefficients for the reliability calculator 510 and/or the detector 504 in any suitable manner. Based upon the disclosure provided herein, one of ordinary skill in the art will recognize a variety of noise predictive filter adaptation circuits that can be used in relation to different embodiments of the present invention and that calculate the noise variance $\sigma^2$ during the adaptation process. The error pattern reliability data 526 is converted to symbol-level reliability data, or non-binary soft information 532, in a converter circuit 530 in the detector output converter 518. The operation of the reliability calculator 510 and the converter circuit 530 in the detector output converter 518 will be described in more detail below with reference to a number of equations. The reliability calculator 510 and the converter circuit 530 in the detector output converter 518 can include any suitable circuitry or any other suitable implementation capable of performing the calculations described in the equations below. Based upon the disclosure provided herein, including the equations set forth below, one of ordinary skill in the art will recognize a variety of circuitry and other devices and systems that can be used in relation to different embodiments of the detector output converter 518.

Figure 6:
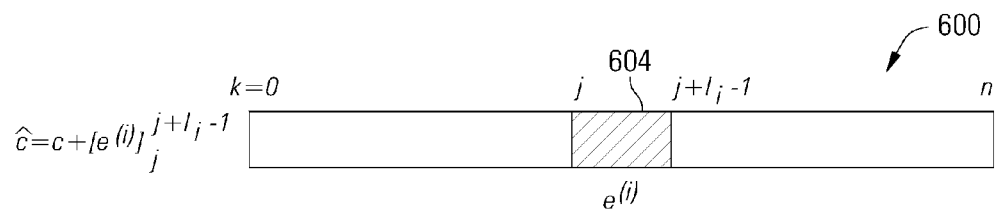
FIG. 6 is a diagram of a dominant error pattern in a binary detector output word in accordance with some embodiments of the present invention.

The following terms are used in various equations herein:
$r_k$: channel observation
$h_k$: partial response maximum likelihood target of length $l_h$
$w_k$: data dependent noise
$l_d$: data dependent length
$\hat{c}_k$: maximum likelihood word
$e_j^{(i)}$: assumed error type i from position or indices j to $j+l_i-1$
$c_k$: maximum likelihood word without error patterns
$\lambda_k$: a priori data values, decoder extrinsic information
$f_m$: noise predictive filter
$l_f$: noise predictive filter length Turning to FIG. 6, a diagram 600 shows a dominant error pattern $e^{(i)}$ 604 in a maximum likelihood word 606 of length k in accordance with some embodiments of the present invention. The dominant error pattern $e^{(i)}$ 604 is an erroneous bit sequence with a pattern and length matching one of the dominant error patterns. The maximum likelihood word 606 can be represented as $$\hat{c} = c + [e^{(i)}]_j^{j+l_i-1}.$$

The reliability for each error pattern $e_j^{(i)}$ with starting position j can be computed in reliability calculator 510 by the local a posteriori probabilities. In other words, the probability of a particular error pattern occurring at a particular location is calculated:

$$Pr(e_j^{(i)} | [r]_{j-l_f+1}^{j+l_i+l_d-2}, [\hat{c}]_{j-l_d+1}^{j+l_i+l_d-2}) \triangleq Pr([\hat{c}]_{j-l_d+1}^{j+l_i+l_d-2}, [e]_j^{j+l_i-1} | [r]_{j-l_f+1}^{j+l_i+l_d-2}, [\hat{c}]_{j-l_d+1}^{j+l_i+l_d-2}) \quad (\text{Eq 1})$$

Equation 1 gives the probability of a dominant error pattern at position j, given a particular value of input data sequence r and corresponding detected sequence ĉ at the positions from bit index $j-l_f+1$ to bit index $j+l_i+l_d-2$. Equation 1 can be manipulated using Bayes' theorem as follows:

$$Pr([\hat{c}]_{j-l_d+1}^{j+l_i+l_d-2}, [e]_j^{j+l_i-1} | [r]_{j-l_f+1}^{j+l_i+l_d-2}, [\hat{c}]_{j-l_d+1}^{j+l_i+l_d-2}) = \quad (\text{Eq 2})$$

-continued $$\frac{Pr\left([r]_{j-l_f+1}^{j+l_i+l_d-2}, [\hat{c}]_{j-l_d+1}^{j+l_i+l_d-2} \mid [\hat{c}]_{j-l_d+1}^{j+l_i+l_d-2}, [e]_j^{j+l_i-1}\right)}{Pr\left([r]_{j-l_f+1}^{j+l_i+l_d-2}, [\hat{c}]_{j-l_d+1}^{j+l_i+l_d-2}\right)} \cdot Pr\left([\hat{c}]_{j-l_d+1}^{j+l_i+l_d-2}, [e]_j^{j+l_i-1}\right)$$

Equation 2 gives the probability of a dominant error pattern occurring at position j. In order to obtain a useful probability value, a reference metric is calculated, giving the ratio of the probability of a dominant error pattern occurring at position j and the probability of no error pattern at the same position. Such a reference metric provides a useful comparison. For example, knowing the probability that a bit has a value of 1 is less useful than a comparison of the probability that the bit will have a value of 1 versus the probability that the bit will have a value of 0. The reference metric enables the detector output converter 518 to determine which decision is more likely correct, the decision that the bit is a 1 or the decision that the bit is a 0.

$$\frac{Pr\left(e_j^{(i)} \mid [r]_{j-l_f+1}^{j+l_i+l_d-2}, [\hat{c}]_{j-l_d+1}^{j+l_i+l_d-2}\right)}{Pr\left(0_j^{(i)} \mid [r]_{j-l_f+1}^{j+l_i+l_d-2}, [\hat{c}]_{j-l_d+1}^{j+l_i+l_d-2}\right)} = \quad \text{(Eq 3)}$$

$$\frac{Pr\left([r]_{j-l_f+1}^{j+l_i+l_d-2}, [\hat{c}]_{j-l_d+1}^{j+l_i+l_d-2} \mid [\hat{c}]_{j-l_d+1}^{j+l_i+l_d-2}, [e]_j^{j+l_i-1}\right) \cdot Pr\left([\hat{c}]_{j-l_d+1}^{j+l_i+l_d-2}, [e]_j^{j+l_i-1}\right)}{Pr\left([r]_{j-l_f+1}^{j+l_i+l_d-2}, [\hat{c}]_{j-l_d+1}^{j+l_i+l_d-2} \mid [\hat{c}]_{j-l_d+1}^{j+l_i+l_d-2}, [0]_j^{j+l_i-1}\right) \cdot Pr\left([\hat{c}]_{j-l_d+1}^{j+l_i+l_d-2}, [0]_j^{j+l_i-1}\right)}$$

where the notation $0_j^{(i)}$ indicates there is no error at position j.

Given the a priori values $\lambda_k$ or actual values 512 from the decoder, pattern-level a priori probabilities can be computed by multiplying the probabilities that the maximum likelihood word has an error at bit position j+k (Equation 4), and by multiplying the probabilities that the maximum likelihood word has no error at bit position j+k (Equation 5):

$$Pr\left([\hat{c}]_{j-l_d+1}^{j+l_i+l_d-2}, [e]_j^{j+l_i-1}\right) = \prod_{k=0, e_k^{(i)} \neq 0}^{l_i-1} Pr(c_{j+k} = -\hat{c}_{j+k}) \quad \text{(Eq 4)}$$

$$Pr\left([\hat{c}]_{j-l_d+1}^{j+l_i+l_d-2}, [0]_j^{j+l_i-1}\right) = \prod_{k=0, e_k^{(i)} \neq 0}^{l_i-1} Pr(c_{j+k} = \hat{c}_{j+k}) \quad \text{(Eq 5)}$$

where $\hat{c}_{j+k}$ is the maximum likelihood word at detector output 506 at position j+k, and where $c_{j+k}$ is a corresponding an error free maximum likelihood word at position j+k. Because each bit can take either the value 1 or −1, the inversion in Equation 4 represents an error in a bit.

Figure 7:
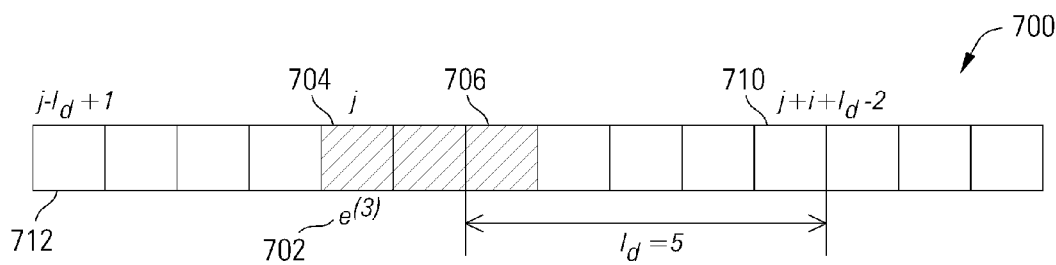
FIG. 7 is a diagram showing data-dependent correlation of a dominant error pattern with other bits in a bit sequence in accordance with some embodiments of the present invention.

In some read channels, such as a read channel including a noise predictive filter for a magnetic recording system, the noise is correlated and data-dependent. The error pattern will affect the metric computation of the next data bit sequence because of this data-dependency. The pattern level reliability information is thus calculated over a range of bit positions. Turning to FIG. 7, a diagram 700 shows the data-dependent correlation of a dominant error pattern 702, in this example error pattern $e^{(3)}$ represented by shaded bit positions in a bit sequence in accordance with some embodiments of the present invention. The error pattern $e^{(3)}$ begins at the fifth bit position 704, denoted as position j, and has a length i of three bits, ending at the seventh bit position 706. The data-dependent length $l_d$ specifies the number of bits following an error that can be affected by that error for a given noise-predictive finite impulse response filter, based on the level of data dependency in the system. The information in $\hat{c}$ from bit position $j-l_d+1$ to bit position $j+i+l_d-2$ and the information in received sequence r from bit position $j-l_f+1$ to bit position $j+i+l_d-2$ is used to compute the relative correlator metric of $e_j^{(i)}$. In the example case where $l_d$ is 5, the last bit of the error pattern $e^{(3)}$ at the seventh bit position 706 can affect up to the 11$^{th}$ bit position 710 at $j+i+l_d-2$. Thus, the expression $j+i+l_d-2$ gives the bit position at the end of the data dependency region following an error pattern. If the error pattern length i is 3 bits, and the error starts at bit position j of index 5, and the data dependent length $l_d$ is 5, then $j+i+l_d-2=5+3+5-2=11$ is the bit index of the last bit 710 to be affected by the last erroneous bit in the error pattern. Similarly, bits preceding the error pattern can affect the bits in the error pattern region, and the bit at index position $j-l_d+1$ 712 is the first bit within a range of $l_d$ that also includes one of the erroneous bits and can therefore affect the bits in the error pattern region from j 702 to j+i−1 706.

Therefore, the assumed error pattern and competing pattern likelihood probabilities are set forth in Equations 6 and 7, which are the branch metric computations for a Viterbi detector based on a Gaussian probability distribution function:

$$Pr\left([r]_{j-l_f+1}^{j+l_i+l_d-2}, [\hat{c}]_{j-l_d+1}^{j+l_i+l_d-2} \mid [\hat{c}]_{j-l_d+1}^{j+l_i+l_d-2}, [e]_j^{j+l_i-1}\right) = \quad \text{(Eq 6)}$$

$$\prod_{k=j}^{j+l_i+l_d-2} \left( \frac{1}{2\pi\sigma^2\left([\hat{c}]_{k-l_d+1}^{k}\right)^{\frac{1}{2}}} * \exp\left( -\frac{\left(r_{k+m} - s_m\left([\hat{c}]_{k-l_d+1}^{k}\right) - m_m\left([\hat{c}]_{k-l_d+1}^{k}\right)\right)^2}{2\sigma^2\left([\hat{c}]_{k-l_d+1}^{k}\right)} \right) \right)$$

-continued $$Pr([r]_{j-l_f+1}^{j+l_i+l_d-2}, [\hat{c}]_{j-l_d+1}^{j+l_i+l_d-2} \mid [\hat{c}]_{j-l_d+1}^{j+l_i+l_d-2}, [0]_j^{j+l_i-1}) = \qquad (Eq\ 7)$$

$$\prod_{k=j}^{j+l_i+l_d-2} \left( \frac{1}{2\pi\sigma^2([\hat{c}]_{k-l_d+1}^k)^{\frac{1}{2}}} * \exp\left( -\frac{\left(r_{k+m} - s_m([\hat{c}]_{k-l_d+1}^k) - m_m([\hat{c}]_{k-l_d+1}^k)\right)^2}{2\sigma^2([\hat{c}]_{k-l_d+1}^k)} \sum_{m=-l_f+1}^{0} f_m([\hat{c}]_{k-l_d+1}^k) \right) \right)$$

where $\sigma^2$ is the noise variance, where $f_m$ is the noise predictive filter, $s_m$ is the ideal branch metric value when there is no error, and where $m_m$ is the noise mean. Again, the probabilities of error (Equation 6) and no error (Equation 7) are both calculated.

The local error pattern correlator metric $C(e_j^{(i)})$ produced by reliability calculator 510 is a log-likelihood ratio, the log of the ratio between the probability of the i'th error pattern at the j'th bit position given received sequence r and detected sequence c, and the probability of no error at the j'th bit position given received sequence r and detected sequence c. The local error pattern correlator metric $C(e_j^{(i)})$ is calculated for every dominant error pattern desired and at every bit position in the codeword according to Equation 8:

$$C(e_j^{(i)}) \triangleq \log\left\{ \frac{Pr(e_j^{(i)} \mid [r]_{j-l_f+1}^{j+l_i+l_d-2}, [\hat{c}]_{j-l_d+1}^{j+l_i+l_d-2})}{Pr(0_j^{(i)} \mid [r]_{j-l_f+1}^{j+l_i+l_d-2}, [\hat{c}]_{j-l_d+1}^{j+l_i+l_d-2})} \right\} = \qquad (Eq\ 8)$$

$$\sum_{k=j}^{j+l_i+l_d-2} \left( -\frac{\left(r_{k+m} - s_m([\hat{c}]_{k-l_d+1}^k) - m_m([\hat{c}]_{k-l_d+1}^k)\right)^2}{2\sigma^2([\hat{c}]_{k-l_d+1}^k)} \sum_{m=-l_f+1}^{0} f_m([\hat{c}]_{k-l_d+1}^k) - \frac{2\pi\sigma^2([\hat{c}]_{j-l_d+1}^{j+l_i+l_d-2})}{2} \right) +$$

$$\log Pr([\hat{c}]_{j-l_d+1}^{j+l_i+l_d-2}, [e]_j^{j+l_i-1}) -$$

$$\sum_{k=j}^{j+l_i+l_d-2} \left( -\frac{\left(r_{k+m} - s_m([\hat{c}]_{k-l_d+1}^k) - m_m([\hat{c}]_{k-l_d+1}^k)\right)^2}{2\sigma^2([\hat{c}]_{k-l_d+1}^k)} \sum_{m=-l_f+1}^{0} f_m([\hat{c}]_{k-l_d+1}^k) - \frac{2\pi\sigma^2([\hat{c}]_{k-l_d+1}^k)}{2} \right) -$$

$$\log Pr([\hat{c}]_{j-l_d+1}^{j+l_i+l_d-2}, [0]_j^{j+l_i-1})$$

With the local error pattern correlator metric $C(e_j^{(i)})$ calculated as error pattern reliability data 526 by the reliability calculator 510 for every dominant error pattern desired and at every bit position in the codeword, the error pattern reliability data 526 can be converted to non-binary soft information 532 by converter 530. For a low density parity check code over GF(q), where $q=2^p$, there are p bits per symbol. For example, for a GF(8) low density parity check code, one symbol consists of 3 bits. The error pattern reliability data 526 can be interpreted as an input matrix C denoting a table of error pattern reliability at each bit position, with non-binary soft information 532 carrying data for a corresponding output matrix $\Pi$, a table of symbol error reliability values:

$$C \triangleq \begin{pmatrix} C(e_0^{(1)}) & C(e_0^{(1)}) & \ldots & C(e_{np-1}^{(1)}) \\ C(e_0^{(2)}) & C(e_1^{(2)}) & \ldots & C(e_{np-1}^{(2)}) \\ \vdots & \vdots & \ddots & \vdots \\ C(e_0^{(L)}) & C(e_1^{(L)}) & \ldots & C(e_{np-1}^{(L)}) \end{pmatrix} \quad \Pi \triangleq \quad \text{(Eq 9)}$$

$$\begin{pmatrix} \pi_{0,0} & \pi_{0,1} & \ldots & \pi_{0,n-1} \\ \pi_{1,0} & \pi_{1,1} & \ldots & \pi_{1,n-1} \\ \vdots & \vdots & \ddots & \vdots \\ \pi_{q-1,0} & \pi_{q-1,1} & \ldots & \pi_{q-1,n-1} \end{pmatrix}$$

where $C(e_j^{(i)})$ is the correlation output metric, L is the number of target dominant error patterns considered, n is the symbol length, $\pi_{l,m}$ is the a posteriori probability of the m'th symbol error taking a particular value $\alpha^{l-1}$, i.e., $\pi_{l,m} \triangleq Pr(E_m = \alpha^{l-1}|r,\hat{c})$ where $E_m = S_m - D_m$, $S_m$ is a transmitted code symbol, $D_m$ is a decision symbol from the detector, and $\alpha \in GF(q)$. In the input matrix C, the column indicates the bit position and the row indicates the dominant error pattern. For example, the $2^{nd}$ row represents the $2^{nd}$ dominant error pattern's reliability information from the 0'th bit position to the np−1'th bit position. In the output matrix $\Pi$, the column represents the symbol index and the row represents the possible states in the symbols. For example, a 2-bit symbol has four possible states 00, 01, 10, 11, and the output matrix $\Pi$ has four rows.

Figure 8:
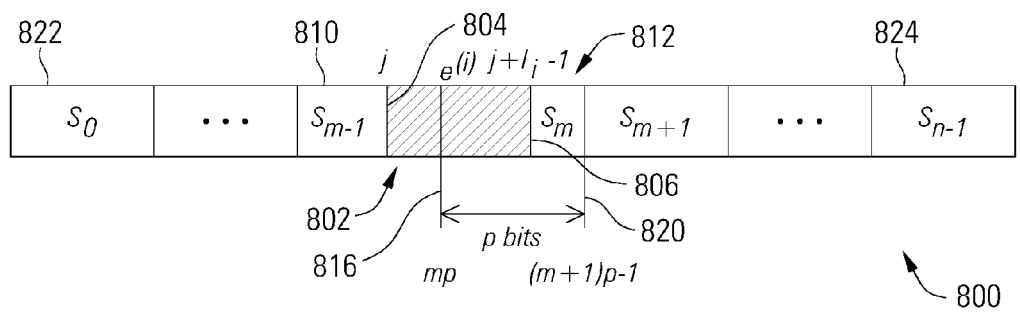
FIG. 8 is a diagram showing a dominant error pattern as it relates to a symbol sequence during detector output conversion in accordance with some embodiments of the present invention.

The converter 530 converts from the input matrix C to the output matrix $\Pi$ using any suitable conversion technique, such as, but not limited to, an exhaustive search. Turning to FIG. 8, a diagram 800 depicts a dominant error pattern $e^{(i)}$ 802 as it relates to a sequence of symbols during detector output conversion in accordance with some embodiments of the present invention. The error pattern $e^{(i)}$ 802, at bit indices j 804 to $j+l_i-1$ 806 corresponds to a portion of symbol $s_{m-1}$ 810 and to a portion of symbol $s_m$ 812. Each symbol has a width 814 of p bits. Symbol $s_m$ 812 corresponds with bit positions mp 816 to $(m+1)p-1$ 820. Because part of the error pattern $e^{(i)}$ 802 overlaps with the symbol $s_m$ 812, the reliability information for the overlapping portion of error pattern $e^{(i)}$ 802 is added to the reliability metric for symbol $s_m$ 812. In some embodiments, this is performed according to Equation 10:

$$\pi_{l,m} \triangleq Pr(E_m = \alpha^{l-1}|r,\hat{c}) \text{ for } 1 = 1, 2, \ldots, \quad \text{(Eq 10)}$$

$$q - 1 = \sum_{[e^{(i)}]_{mp}^{(m+1)p-1} = \alpha^{l-1}, \forall i} Pr(e_j^{(i)}|r,\hat{c}) \approx$$

$$\pi_{0,m} \left( \sum_{[e^{(i)}]_{mp}^{(m+1)p-1} = \alpha^{l-1}, \forall i} \exp(C(e_j^{(i)})) \right)$$

where $\pi_{l,m}$ is defined to be the probability that the symbol error $E_m$ has a value of $\alpha^{l-1}$ for a given received sequence r and detected maximum likelihood word $\hat{c}$. To calculate this probability, the reliability information for every error pattern within the symbol $s_m$ 812 is summed, and this process is repeated for every symbol from $S_0$ 822 to $S_{n-1}$ 824. The probabilities of symbol errors $E_m$ are related to the probabilities of decision symbols $D_m$ from the detector as set forth in Equation 11:

$$Pr(S_m = D_m + \alpha^{l-1}|r,\hat{c}) = Pr(E_m = \alpha^{l-1}|r,\hat{c}) \quad \text{(Eq 11)}$$

The converter 530 is not limited to the exhaustive search of Equations 10 and 11 or to any particular method of converting from error pattern reliability data 526 to non-binary soft information 532. However, an example of the exhaustive search conversion is set forth in Equations 12-17, for the example case with 3-bit symbols:

$$P(E_m = [100]|r,\hat{c}) = \quad \text{(Eq 12)}$$
$$Pr(e_{mp}^{(1)}|r,\hat{c}) + \underbrace{Pr(e_{mp-1}^{(2)}|r,\hat{c}) + Pr(e_{mp-2}^{(3)}|r,\hat{c}) + \ldots + Pr(e_{mp-i+1}^{(i)}|r,\hat{c})}_{\text{partially contributed error pattern's probabilities from left}}$$

$$P(E_m = [010]|r,\hat{c}) = Pr(e_{mp}^{(1)}|r,\hat{c}) \quad \text{(Eq 13)}$$

$$P(E_m = [001]|r,\hat{c}) = \quad \text{(Eq 14)}$$
$$Pr(e_{mp+2}^{(1)}|r,\hat{c}) + \underbrace{Pr(e_{mp+2}^{(2)}|r,\hat{c}) + Pr(e_{mp+2}^{(3)}|r,\hat{c}) + \ldots + Pr(e_{mp+2}^{(i)}|r,\hat{c})}_{\text{partially contributed error pattern's probabilities from right}}$$

$$P(E_m = [110]|r,\hat{c}) = \quad \text{(Eq 15)}$$
$$Pr(e_{mp}^{(2)}|r,\hat{c}) + \underbrace{Pr(e_{mp-1}^{(3)}|r,\hat{c}) + Pr(e_{mp-2}^{(3)}|r,\hat{c}) + \ldots + Pr(e_{mp-i+2}^{(i)}|r,\hat{c})}_{\text{partially contributed error pattern's probabilities from right}}$$

$$P(E_m = [011]|r,\hat{c}) = \quad \text{(Eq 16)}$$
$$Pr(e_{mp+1}^{(2)}|r,\hat{c}) + \underbrace{Pr(e_{mp+1}^{(3)}|r,\hat{c}) + Pr(e_{mp+1}^{(4)}|r,\hat{c}) + \ldots + Pr(e_{mp+1}^{(i)}|r,\hat{c})}_{\text{partially contributed error pattern's probabilities from right}}$$

$$P(E_m = [111] | r, \hat{c}) = \qquad \text{(Eq 17)}$$
$$Pr(e_{mp}^{(3)} | r, \hat{c}) + \underbrace{Pr(e_{mp-1}^{(4)} | r, \hat{c}) + Pr(e_{mp}^{(4)} | r, \hat{c}) + \ldots + Pr(e_{mp}^{(i)} | r, \hat{c})}_{\text{partially contributed error pattern's probabilities from left and right}}$$

In Equation 12, for the error probability where symbol error $E_m=[100]$, the error pattern reliability data for all bits corresponding to the 1 in [100] are added. This includes the reliability of the $e_{mp}^{(1)}$ error pattern, which is 1 bit long and which occurs at bit position mp. This also includes the reliability of the $e_{mp-1}^{(2)}$ error pattern, which is 2 bits long and which occurs at bit position mp−1, the reliability of the $e_{mp-2}^{(3)}$ error pattern, which is 3 bits long and which occurs at bit position mp−2, and so on to the reliability of the $e_{mp-i+1}^{(i)}$ error pattern, which is i bits long and which occurs at bit position mp−i+1. This includes all the possible error patterns that end at such a position that corresponds with the symbol error $E_m=[100]$. Because of the two trailing 0's, there are no bit errors that affect the middle or right-most symbol error bits, so the probabilities of bit errors that would correspond to those symbol error bits are not added. For example, in Equation 13, only the reliability of the $e_{mp+1}^{(1)}$ error pattern is included.

In order to simplify the conversion process in converter 530, several assumptions are made in some embodiments. In some embodiments, it is assumed that only one error pattern exists in each symbol. To support this simplifying assumption, the symbol error probability table can combine two or more symbol errors. For example, the probability of symbol error $E_m=[101]$ can be estimated by combining the probability of symbol errors $E_m=[100]$ and $E_m=[001]$. Moreover, a composite error pattern can be constructed in a structured manner from the single or multiple error patterns that appear earlier in the list of error patterns ordered according to their decimal values.

In the example embodiment of conversion according to Equation 10, the quantity $\pi_{l,m} \triangleq Pr(E_m = \alpha^{l-1}|r, \hat{c})$ is not known, and the probability that a symbol has no error is therefore approximated. By using the fact that the summation of the probability of symbol error is equal to 1, $\pi_{l,m}=1$ for $\forall m$, $\pi_{0,m}$ can be obtained according to Equations 18 and 19:

$$\sum_{l=0}^{q-1} \pi_{l,m} = \pi_{0,m} + \sum_{l=1}^{q-1} \pi_{l,m} = \qquad \text{(Eq 18)}$$

$$\pi_{0,m} + \pi_{0,m} \sum_{l=1}^{q-1} \left( \sum_{[e^{(i)}]_{mp}^{(m+1)p-1} = \alpha^{l-1}, \forall i} \exp(C(e_j^{(i)})) + \left\{ \begin{array}{c} \text{probability of} \\ \text{composite} \\ \text{error patterns} \end{array} \right\} \right) = 1 \text{ for } \forall m$$

$$\therefore \pi_{0,m} = \qquad \text{(Eq 19)}$$

$$1 / \left( 1 + \sum_{l=1}^{q-1} \left( \sum_{[e^{(i)}]_{mp}^{(m+1)p-1} = \alpha^{l-1}, \forall i} \exp(C(e_j^{(i)})) + \left\{ \begin{array}{c} \text{probability of} \\ \text{composite} \\ \text{error patterns} \end{array} \right\} \right) \right)$$
$$\text{for } \forall m$$

Figure 9:
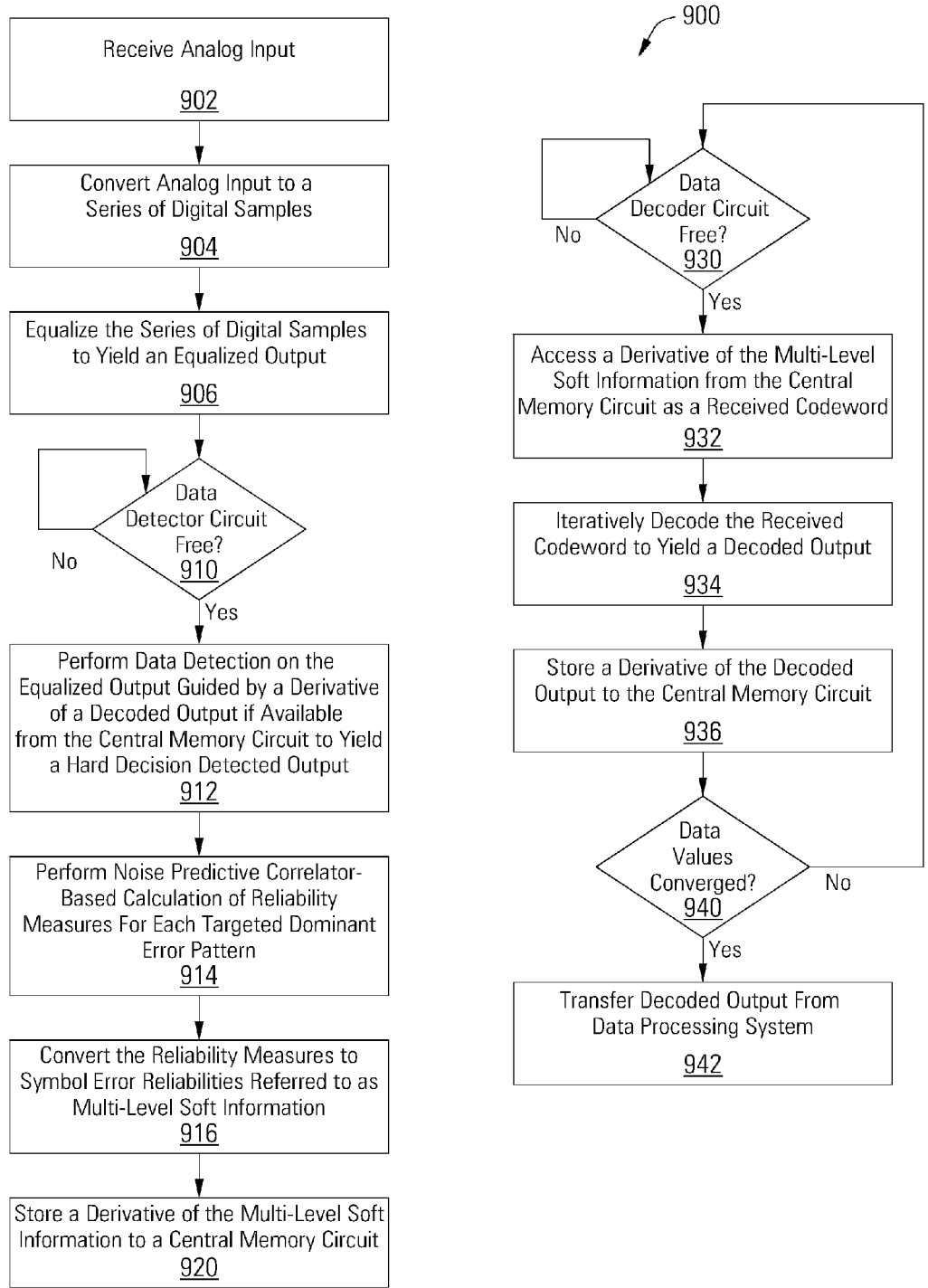
FIG. 9 is a flow diagram showing a method for converting a binary detector hard decision output to multi-level soft information based on error pattern reliability in accordance with some embodiments of the present invention.

Turning to FIG. 9, a flow diagram 900 shows a method for processing data including converting a binary hard decision detector output to multi-level soft information in accordance with some embodiments of the present invention. Following flow diagram 900, an analog input is received. (Block 902) In some embodiments, the analog input is received as it is read from a magnetic medium such as a disk platter by a read/write head, or as it is read from a solid state memory, or as it is received from a data transmission channel. Based upon the disclosure provided herein, one of ordinary skill in the art will recognize a variety of sources of the analog input. The analog input is converted to a series of digital samples. (Block 904) This conversion can be performed using an analog to digital converter as is known in the art. Of note, any circuit known in the art that is capable of converting an analog signal into a series of digital values representing the received analog signal may be used. The resulting digital samples are equalized to yield an equalized output. (Block 906) In some embodiments of the present invention, the equalization is done using a digital finite impulse response circuit as is known in the art. Based upon the disclosure provided herein, one of ordinary skill in the art will recognize a variety of equalizer circuits that may be used in place of such a digital finite impulse response circuit to perform equalization in accordance with different embodiments of the present inventions.

It is determined whether a data detector circuit with hard decision output is available. (Block 910) In some embodiments, the data detector circuit comprises a binary detector with hard decision output, such as, but not limited to, a Viterbi detector or a maximum likelihood detector. Where a data detector circuit is available (block 910), a data detection algorithm is applied to the equalized output guided by a data set derived from a decoded output where available (e.g., the second and later iterations through the data detector circuit and the data decoder circuit) from a central memory circuit, to yield a hard decision detected output. (Block 912)

A noise predictive correlator-based calculation of reliability measures is performed for each targeted dominant error pattern. (Block 914) The calculation is performed based on the hard decision detected output, on the equalized output, and on a priori values, which can be obtained from a decoder (block 934). The reliability measures are calculated in some embodiments according to Equations 1-8. The reliability measures for the dominant error patterns are bit-based or local error pattern reliability measures. The reliability measures are converted to symbol error reliabilities referred to as multi-level soft information. (Block 916) The conversion to symbol error reliabilities can be performed in any suitable manner, such as, but not limited to, using an exhaustive search according to Equations 9-19. A signal derived from the multi-level soft information (e.g., a locally interleaved version of the multi-level soft information) is stored to the central memory (e.g., 428) to await processing by a data decoder circuit. (Block 920)

In parallel to the previously discussed data detection processing, it is determined whether a data decoder circuit is available. (Block 930) Where the data decoder circuit is available (block 930) a previously stored derivative of the multi-level soft information is accessed from the central memory and used as a received codeword. (Block 932) The received codeword is iteratively processed in the data decoder circuit to yield a decoded output. (Block 934) In some embodiments of the present inventions, the data decoding algorithm is an LDPC decoding algorithm. Based upon the disclosure provided herein, one of ordinary skill in the art will recognize other decode algorithms that may be used in relation to different embodiments of the present inventions. A derivative of the decoded output is stored to the central memory circuit. (Block 936) A determination is made as to whether data values have converged in the data decoding circuit. (Block 940) In some embodiments, this includes determining whether log-likelihood ratio values representing the likelihood that decoded values for the data reach a particular threshold, and/or whether parity check equations for the data are satisfied. Where the data decoding converged (block 940), the decoded output for the data sector is output from the data processing system. (Block 942) The decoded output may be transferred out as hard decision data and cleared from the central memory circuit, freeing space for another data sector to be read, detected and decoded. Data sectors are transferred out of the data processing system in the order of completion, or in some cases, in the requested order. Alternatively, where the data decoding failed to converge (block 940), data processing continues with another local iteration (block 930) until the maximum number of local iterations has been performed, at which point another global iteration is performed (block 910).

By using a binary hard decision detector and converting the output to multi-level soft information for use by a decoder, a long memory buffer is not needed in the detector unlike detectors implementing trellis-searching algorithms such as soft output Viterbi algorithm detectors or Bahl-Cocke-Jalinek-Raviv (BCJR) detectors. The latency of the algorithm is significantly reduced. Because the simple correlators of the error patterns are processed in parallel, the overall complexity is lower than the more complex soft output detectors. When targeting low symbol error rates, a small number of dominant error patterns is sufficient to cover all errors and compute the symbol-level reliability information.

It should be noted that the various blocks shown in the drawings and discussed herein can be implemented in integrated circuits along with other functionality. Such integrated circuits can include all of the functions of a given block, system or circuit, or a subset of the block, system or circuit. Further, elements of the blocks, systems or circuits can be implemented across multiple integrated circuits. Such integrated circuits can be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein can be implemented in either software or firmware. In some such cases, the entire system, block or circuit can be implemented using its software or firmware equivalent. In other cases, the one part of a given system, block or circuit can be implemented in software or firmware, while other parts are implemented in hardware.

In conclusion, the present invention provides novel systems and methods for converting detector output to multi-level soft information. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
   a binary data detector having a hard decision output and operable to detect values in input data samples;
   a reliability calculator operable to calculate an error pattern reliability metric for each of a plurality of dominant error patterns associated with the hard decision output, wherein the reliability calculator is operable to calculate the plurality of error pattern reliability metrics based on the hard decision output, on the input data samples, on a priori values of the input data samples, and on a noise variance for the data processing system; and
   a converter operable to convert the plurality of error pattern reliability metrics to multi-level soft information.

2. The data processing system of claim 1, wherein the binary data detector comprises a detector selected from a group consisting of a Viterbi detector and a maximum likelihood detector.

3. The data processing system of claim 1, further comprising a data decoder operable to decode the multi-level soft information.

4. The data processing system of claim 3, wherein the data decoder comprises a low density parity check decoder.

5. The data processing system of claim 1, wherein the multi-level soft information comprises log-likelihood ratios for multi-bit symbols.

6. The data processing system of claim 1, wherein the reliability calculator comprises a noise-predictive correlator-based calculator for each of the plurality of dominant error patterns.

7. The data processing system of claim 1, wherein the converter is operable to convert from a matrix representing the plurality of error pattern reliability metrics to a matrix comprising the multi-level soft information for multi-bit symbols.

8. The data processing system of claim 1, wherein the converter is operable to add probabilities of each of the plurality of dominant error patterns at bit locations that impact a particular symbol to calculate the multi-level soft information for the particular symbol.

9. The data processing system of claim 8, wherein the plurality of dominant error patterns at the bit locations that impact the particular symbol are identified using an exhaustive search in the converter.

10. The data processing system of claim 1, further comprising a noise predictive filter adaptation circuit operable to calculate a noise variance used by the reliability calculator to calculate the error pattern reliability metric for each of the plurality of dominant error patterns.

11. The data processing system of claim 1, wherein the data processing system is implemented as an integrated circuit.

12. The data processing system of claim 1, wherein the data processing system is incorporated in a storage device.

13. A method for processing data, comprising:
   performing a detection algorithm on data samples at an input to a binary detector to yield a hard decision output;
   calculating a reliability metric for each of a plurality of error patterns associated with the hard decision output, wherein calculating the reliability metric for one of the plurality of error patterns comprises calculating a log of a ratio between a probability of the error pattern occurring at a particular bit position given a particular sequence in the data samples and a particular sequence in the hard decision output, and a probability of no error pattern occurring at the particular bit position given the particular sequence in the data samples and the particular sequence in the hard decision output; and converting the plurality of reliability metrics to multi-level soft information.

14. The method of claim 13, wherein the reliability metric for each of the plurality of error patterns is calculated based on the hard decision output, on the data samples, on the actual values of the data samples, and on a noise variance value.

15. The method of claim 13, further comprising decoding the multi-level soft information in a low density parity check decoder.

16. The method of claim 13, wherein the multi-level soft information comprises symbol-based log-likelihood ratios.

17. The method of claim 13, wherein converting the plurality of reliability metrics to multi-level soft information comprises adding probabilities of each of the plurality of dominant error patterns at bit locations that impact a particular symbol to calculate the multi-level soft information for the particular symbol.

18. A storage device, comprising:
a storage medium operable to store user data and servo data;
a head assembly disposed in relation to the storage medium and operable to read and write data on the storage medium; and
a data processing system operable to process a signal read from the storage medium by the head assembly, the data processing system comprising:
an analog to digital converter operable to sample the signal to yield digital data;
an equalizer operable to filter the digital data to yield equalized data samples;
a binary detector operable to detect values of the equalized data samples to yield hard decisions;
a detector output converter operable to convert the hard decisions to multi-level soft information representing symbol likelihood values, comprising a reliability calculator operable to calculate an error pattern reliability metric for each of a plurality of dominant error patterns associated with the hard decisions, wherein the detector output is operable to add probabilities of each of the plurality of dominant error patterns at bit locations that impact a particular symbol to calculate the multi-level soft information for the particular symbol; and
a decoder operable to decode the multi-level soft information.

19. The storage device of claim 18, wherein the plurality of dominant error patterns at the bit locations that impact the particular symbol are identified using an exhaustive search in the detector output converter.

20. The storage device of claim 18, wherein the detector output converter further comprises a noise predictive filter adaptation circuit operable to calculate a noise variance used by the reliability calculator to calculate the error pattern reliability metric for each of the plurality of dominant error patterns.

* * * * *